United States Patent [19]

Glenn et al.

[11] Patent Number: 5,596,485
[45] Date of Patent: Jan. 21, 1997

[54] PLASTIC PACKAGED INTEGRATED CIRCUIT WITH HEAT SPREADER

[75] Inventors: Thomas P. Glenn, Gilbert, Ariz.; Roy D. Holloway, Sucat, Philippines

[73] Assignee: Amkor Electronics, Inc., Chandler, Ariz.

[21] Appl. No.: 405,462

[22] Filed: Mar. 16, 1995

[51] Int. Cl.⁶ ........................................... H05K 7/20
[52] U.S. Cl. ..................... 361/703; 174/16.3; 174/52.2; 361/719
[58] Field of Search ................... 165/80.3, 185; 174/16.3, 52.2, 52.4, 252; 257/675, 687, 706, 707, 712, 713; 361/761, 764, 792, 795, 689, 690, 702–704, 717–719

[56] References Cited

U.S. PATENT DOCUMENTS

| | | | |
|---|---|---|---|
| 4,809,053 | 2/1989 | Kuraishi | 357/70 |
| 5,105,259 | 4/1992 | McShane | 357/72 |
| 5,225,710 | 7/1993 | Westerkamp | 257/713 |
| 5,241,133 | 8/1993 | Mullen, III | 174/52.4 |
| 5,309,320 | 5/1994 | Smith | 361/704 |
| 5,311,060 | 5/1994 | Rostoker | 257/796 |
| 5,353,193 | 10/1994 | Chia | 361/704 |
| 5,367,196 | 11/1994 | Mahulikar | 257/787 |

FOREIGN PATENT DOCUMENTS

| | | |
|---|---|---|
| 403280453 | 12/1991 | Japan . |
| 405145002A | 6/1993 | Japan . |
| 405267503 | 10/1993 | Japan . |

*Primary Examiner*—Gerald P. Tolin
*Attorney, Agent, or Firm*—Skjerven, Morrill, MacPherson, Franklin & Friel; Alan H. MacPherson; Thomas S. MacDonald

[57] ABSTRACT

A heat spreader with one or more integrally formed open regions discourages the formation of air bubbles in the encapsulant of a plastic packaged integrated circuit. Little or no air bubbles can be trapped between the heat spreader and the encapsulant surface. Any air bubbles that do form in the encapsulant can escape through the open regions of the heat spreader. The heat spreader of the invention is placed on the surface of a liquid encapsulant and the encapsulant fills the open regions of the heat spreader and covers the sides of the open regions. When the encapsulant hardens, a form fitting bond between the heat spreader and the upper surface of the encapsulant is created. This form fitting bond provides for secure attachment of the heat spreader to the surface of the encapsulant. One embodiment of the heat spreader of the invention includes integrally formed tabs with which a supplementary heat spreader, such as heat tower, is inserted for even greater heat dissipation capability.

8 Claims, 12 Drawing Sheets

5,596,485

PLASTIC PACKAGED INTEGRATED CIRCUIT WITH HEAT SPREADER

BACKGROUND OF THE INVENTION

1. Field of the Invention

This invention relates to an improved heat spreader for use with integrated circuit packages and in particular to an improved heat spreader for use with plastic integrated circuit packages.

2. Prior Art

As semiconductor production volumes have increased, more cost effective packages for integrated circuit chips have been developed. In particular, the plastic integrated circuit package, such as the ball grid array package, described in U.S. Pat. No. 5,241,133, has proven to be an acceptable type of integrated circuit package. Plastic integrated circuit packages have several advantages including: low production costs, increased input/output lead capabilities, and small size. However, plastic integrated circuit packages provide relatively poor heat dissipation from the integrated circuit chip to the environment or ambient outside the package. This is because plastic, unlike the materials used in older packaging techniques such as metal or ceramics, is thermally insulative and tends-to trap the heat generated by the integrated circuit chip within the package itself.

The inability of plastic integrated circuit packages to efficiently dissipate heat is a particular problem since new generations of integrated circuit chips are high power devices that generate considerable heat. This heat can adversely effect the performance of the integrated circuit chip, and even destroy the integrated circuit chip, if the generated heat is not effectively conducted away from the integrated circuit chip to the outside environment. Therefore, unless measures are taken to increase the heat dissipation capabilities of plastic packages, this otherwise highly advantageous form of integrated circuit chip packaging can be unsuitable for new generations of integrated circuit chips.

Some plastic packages have been fitted with a heat spreader in an effort to improve heat dissipation. FIG. 1A is a cross-sectional side view of a ball grid array package 100 with a prior art heat spreader 102 made of a flat sheet of metal. Ball grid array 100 includes a substrate 104 with insulation layers 106, conductive trace layers 108, and cavity 116. An integrated circuit chip 114 is positioned in the bottom of cavity 116. Bond wires 118 make the electrical connections between bond pads (not shown) on integrated circuit chip 114 and a first conductive trace layer 108a on substrate 104. (In an alternative embodiment, the integrated circuit chip is mounted in "flip chip" or "C4" configuration without the use of bond wires 118. Flip-chip mounting of integrated circuits is well known in the art. Therefore, a detailed description of this method is omitted).

Vias or conductive through holes 122 are used to electrically connect conductive trace layer 108a with the other conductive trace layers 108 and solder balls 110. Solder balls 110 are then used to make electrical connection between ball grid array 100 and a next level electrical structure (not shown) such as a printed circuit board.

Once integrated circuit chip 114 is positioned in cavity 116, and electrical connections are made, cavity 116 filled with encapsulant 120. Typically, encapsulant 120 is in liquid form when it is applied in cavity 116. After application, encapsulant 120 is cured and solidifies to form a protective case around integrated circuit chip 114. Encapsulant 120 is typically an epoxy base resin.

Once encapsulant 120 solidifies, prior art heat spreader 102 is attached to prior art ball grid array 100 with adhesive layer 112. FIG. 1B is a plan view of the lower surface 102a of prior art heat spreader 102. FIG. 1C is an perspective side view of prior art heat spreader 102 attached to ball grid array 100. Typically, lower surface 102a of heat spreader 102 is affixed to the upper surface 104a of substrate 104 and the upper surface 120a of encapsulant 120 with adhesive layer 112.

FIG. 2 is a cross-sectional side view of a second prior art ball grid array package 200 with heat spreader 102. In the embodiment of FIG. 2, cavity 216 is created by the application of a plastic over-mold 206 which covers sides 208 and partially covers upper surface 204a of substrate 204. Once created, cavity 216 is filled with encapsulant 120 as described above with respect to prior art ball grid array 100. Heat spreader 102 is then applied to upper surface 120a of encapsulant 120 with adhesive layer 112 as also described above.

To allow optimum heat dissipation, the heat generated by integrated circuit chip 114 should be conducted as directly as possible from integrated circuit chip 114, through encapsulant 120, to heat spreader 102 which then radiates the heat to the external environment. However, with prior art ball grid arrays 100 and 200, adhesive layer 112 represents an additional, and possibly thermally insulative, layer between integrated circuit chip 114 and heat spreader 102. Therefore, with prior art ball grid arrays 100 and 200, heat is not dissipated as efficiently as possible and the electrical performance of integrated circuit chip 114 can suffer. Further, adhesive layer 112 represents additional production cost, both in terms of materials used and the time and equipment necessary apply those materials.

Attempts have been made to eliminate adhesive layer 112 by applying prior art heat spreader 102 directly to upper surface 120a of encapsulant 120 while encapsulant 120 is still in liquid form. Lower surface 102a of heat spreader 102 then bonds directly with upper surface 120a of encapsulant 120 as encapsulant 120 solidifies. In theory, the adhesion takes place without using any additional adhesive. However, this method has proven ineffective for use with prior art heat spreader 102 for two reasons. First, the continuous, and typically smooth, lower surface 102a of prior art heat spreader 102 (see FIG. 1B) makes the bond between heat spreader 102 and surface 120a of encapsulant 120 unreliable. As a result, prior art heat spreader 102 can separate from the plastic integrated circuit package. Second, as described in detail below, applying prior art heat spreader 102 directly to encapsulant 120 often causes air bubbles to form in encapsulant 120. These air bubbles create serious problems with respect to circuit performance and package reliability.

FIG. 3 is a cross-sectional side view of a prior art ball grid array 300 with prior art heat spreader 102 applied directly to upper surface 120a of encapsulant 120. FIG. 3 shows air bubbles 302 which often form when prior art heat spreader 102 is applied directly to surface 120a of encapsulant 120.

Air bubbles 302 create several problems. First, the air in air bubbles 302 can become a thermally insulative layer between integrated circuit chip 314 and heat spreader 102 (see for example air bubble 302a in FIG. 3). The additional thermal insulation created by air bubbles 302 defeats the purpose of applying heat spreader 102 directly to encapsulant 120 in the first place, i.e., to decrease insulation between integrated circuit chip 314 and heat spreader 102 by eliminating adhesive layer 112 (see FIG. 1A).

In addition, air bubbles 302 can form in, or move to, the areas 314 within cavity 316 surrounding bond wires 118. As a result, bond wires 118 lose the support provided by encapsulant 120 and break more easily, causing the integrated circuit to fail.

Further, contaminants, such as moisture, can be trapped in air bubbles 302. These contaminants can compromise package integrity and adversely affect the performance and reliability of integrated circuit chip 314.

Additionally, the heat generated by integrated circuit chip 314 can cause the air trapped in air bubbles 302 to expand. As the air expands, it can put pressure on encapsulant 120 and create stress cracks in the package which further compromise package integrity.

As described above, it is highly desirable to avoid forming air bubbles 302 in encapsulant 120. Air bubbles 302 form in encapsulant 120 because prior art heat spreaders 102 are typically a uniform and continuous metal sheet or plate (see FIGS. 1B and 1C). As a result of their uniform structure, when prior art heat spreaders 102 are initially placed directly on surface 120a of encapsulant 120, air between the lower surface 102a of heat spreader 102 and upper surface 120a of encapsulant 120 is forced down into encapsulant 120 (recall that encapsulant 120 is, at this point in the manufacturing process, in liquid form). The high viscosity of encapsulant 120 in its liquid form often prevents air bubbles 302 from escaping to the sides 310 of cavity 116 before encapsulant 120 cures and hardens. As a result, when encapsulant 120 hardens, air bubbles 302 are permanently formed in cavity 116.

Several unsuccessful attempts have been made to resolve the air bubble problem. For instance, dimples or indentations (not shown) have been added to the lower surface 102a of heat spreader 102 to allow the air to escape before heat spreader 102 settles into position. In another attempt, heat spreader 102 has been given a negative draft to force air bubbles 302 to the side and out of cavity 316. However, due to the high viscosity of encapsulant 120 in its liquid state, these attempts to solve the problem have proven ineffective and manufacturers of integrated circuit chip packages have typically been forced to attach prior art heat spreader 102 to the integrated circuit package with adhesive layer 112.

What has been sought is a heat spreader which can be applied directly to the surface of an encapsulant, when the encapsulant is in a liquid state, so that the heat spreader is secured to a surface of encapsulant without the use of adhesives and without forming air bubbles within the encapsulant.

SUMMARY OF THE INVENTION

The method and article of the invention provides for an integrated circuit package which includes a heat spreader with one or more open regions integrally formed in the heat spreader material.

In one embodiment of the invention, a heat spreader comprises a thermally conductive plate made of, for example, aluminum, copper, or an equivalent thermally conductive material. The heat spreader is formed in a predetermined shape, usually a substantially square or rectangular shape. The heat spreader has a first or bottom surface and a second or top surface, opposite the first surface. The heat spreader also has a predetermined thickness and at least one open region. The open regions can be any shape desired such as: triangular, rectangular, oval, semicircular or square.

Once the heat spreader of this embodiment of the invention is created, the first surface of the heat spreader is applied directly (i.e., without the use of an additional adhesive) to a first surface of the encapsulant, while the encapsulant is still in liquid form. As the encapsulant hardens, a fitted bond is formed between the first surface of the heat spreader and the first surface of the encapsulant.

In another embodiment of the invention, at least one tab is formed on, or of, the heat spreader material. In one version of this embodiment, the tabs are formed by stamping or cutting the heat spreader material in the outline of the open region desired while leaving one portion of the outlined material attached to the heat spreader. The outlined material is then bent back and shaped to form a tab. Once created, the tab portions of this embodiment can either stand alone and provide more surface area for heat dissipation, or they can be used to secure an additional heat spreader or heat tower to further facilitate the dissipation of heat from the integrated circuit package.

The open regions of the disclosed heat spreaders provide the heat spreaders of the invention with several advantages over the prior art. First, the open regions of the heat spreader discourage the formation of air bubbles in the encapsulant because little or no air can be trapped between the heat spreader and the encapsulant surface. Further, any air bubbles that do form in the encapsulant can escape through the open regions of the heat spreader. Additionally, when the heat spreader of the invention is placed on the surface of the liquid encapsulant, the encapsulant fills the open regions of the heat spreader and covers the sides of the open regions. As a result, when the encapsulant hardens, a form fitting bond between the heat spreader and the upper surface of the encapsulant is created. This form fitting bond provides for more secure attachment of the heat spreader to the surface of the encapsulant than is possible with typical prior art heat spreaders.

Other advantages of the heat spreaders of the invention will become apparent in the following detailed description of the invention and in the Figures.

DETAILED DESCRIPTION OF THE DRAWINGS

Figure 4A:
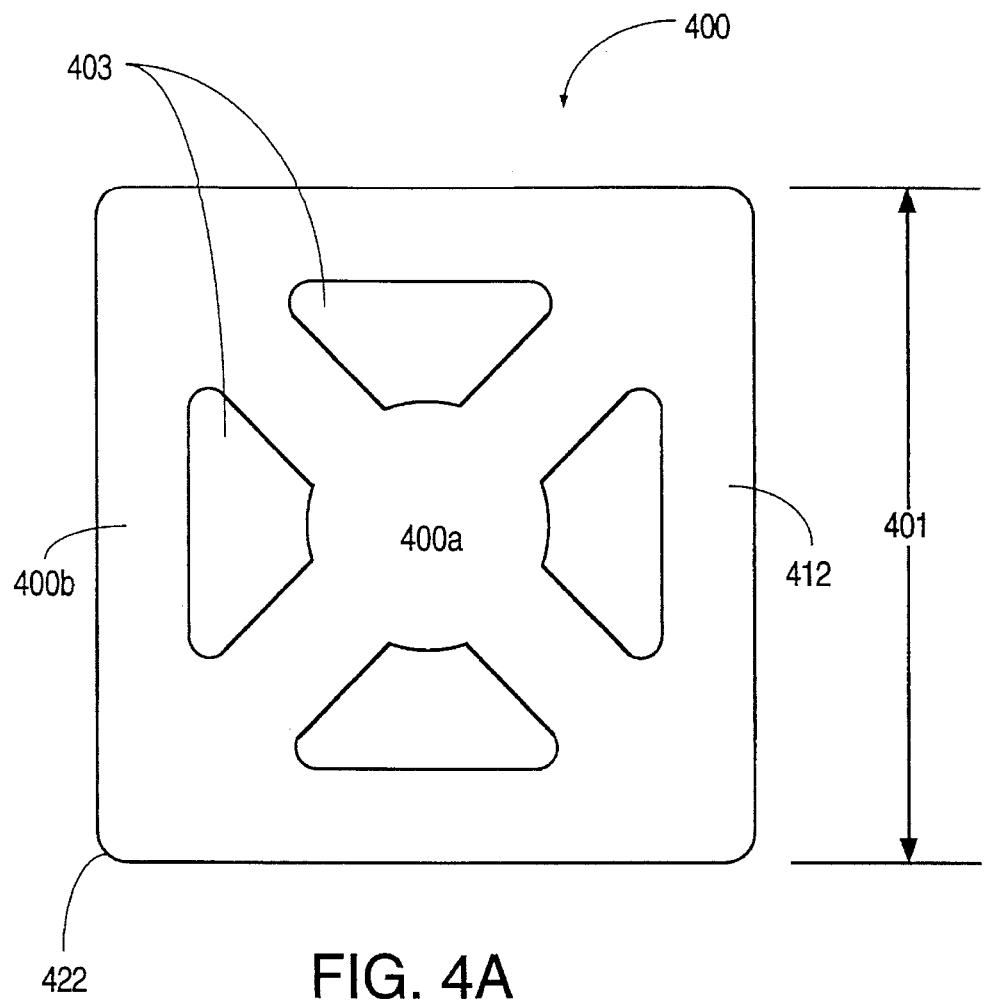
FIG. 4A is a plan view of one embodiment of a heat spreader in accordance with the invention.

FIG. 4A is a plan view of one embodiment of a heat spreader 400 in accordance with the invention. Heat spreader 400 is formed from a thin (in one embodiment 0.015 inch or 0.381 millimeter thick) thermally conductive plate 412. Plate 412 may be anodized, copper, or any other thermally conductive material.

Heat spreader 400 can be made to any dimensions desired. However, heat spreader 400 is generally square or rectangular in shape. For example, in one embodiment, heat spreader 400 is a square with a side length 401 of 0.720 inch or 18.29 millimeter and a thickness 402 (see FIG. 4B) of 0.015 inch or 0.381 millimeter. Heat spreader 400 can also be formed with rounded corners 422. Heat spreader 400 includes open regions 403 which are formed by molding, punching or cutting out predetermined portions of heat spreader 400.

Open regions 403 can be any one of numerous shapes including: substantially triangular (as shown in FIG. 4A), substantially square, substantially rectangular, substantially oval, substantially elliptical, or substantially semi-circular.

Figure 4B:
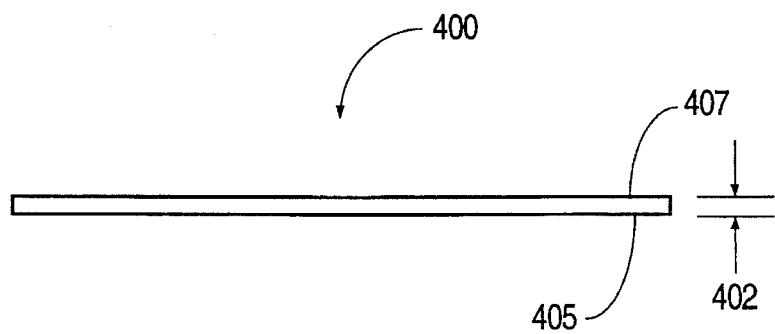
FIG. 4B is a side view thereof.

FIG. 4B is a side view of heat spreader 400 showing the first or lower surface 405 of heat spreader 400 which is placed on the first or upper surface 120a of encapsulant 120 (see FIG. 4D), the second or upper surface 407 of heat spreader 400, which is generally exposed to the ambient or outside environment, and the thickness 402. The heat spreader 400 shown has substantially triangular or substantially trapezoidal open regions which open regions are bounded by edges of a central area 400a, edges of peripheral portions 400b of the spreader and edges of a series of four radial arms extending between the central area and the peripheral portions.

Figure 4C:
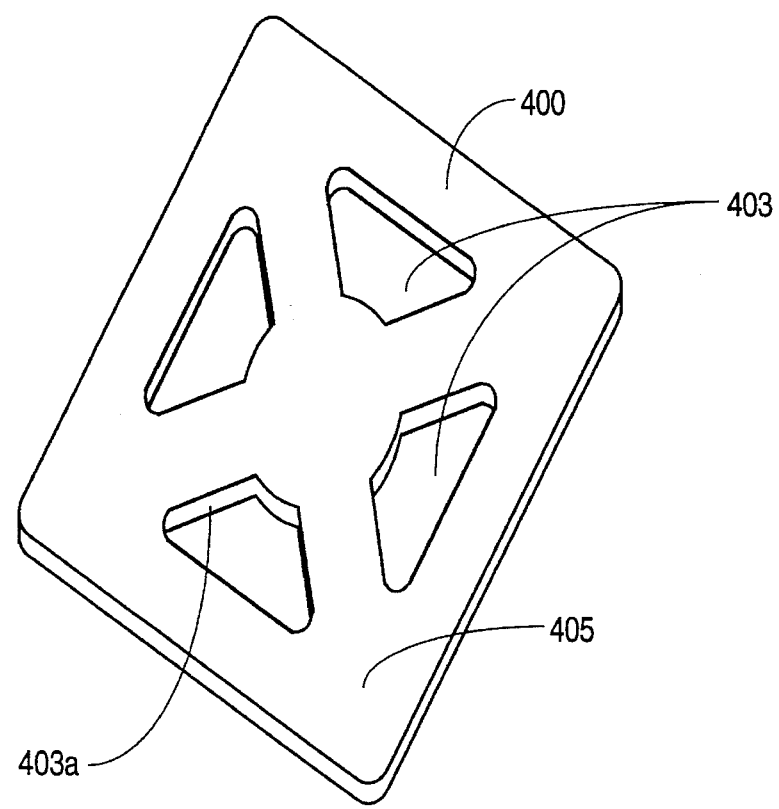
FIG. 4C is a perspective view of the heat spreader of FIG. 4A.
Figure 4D:
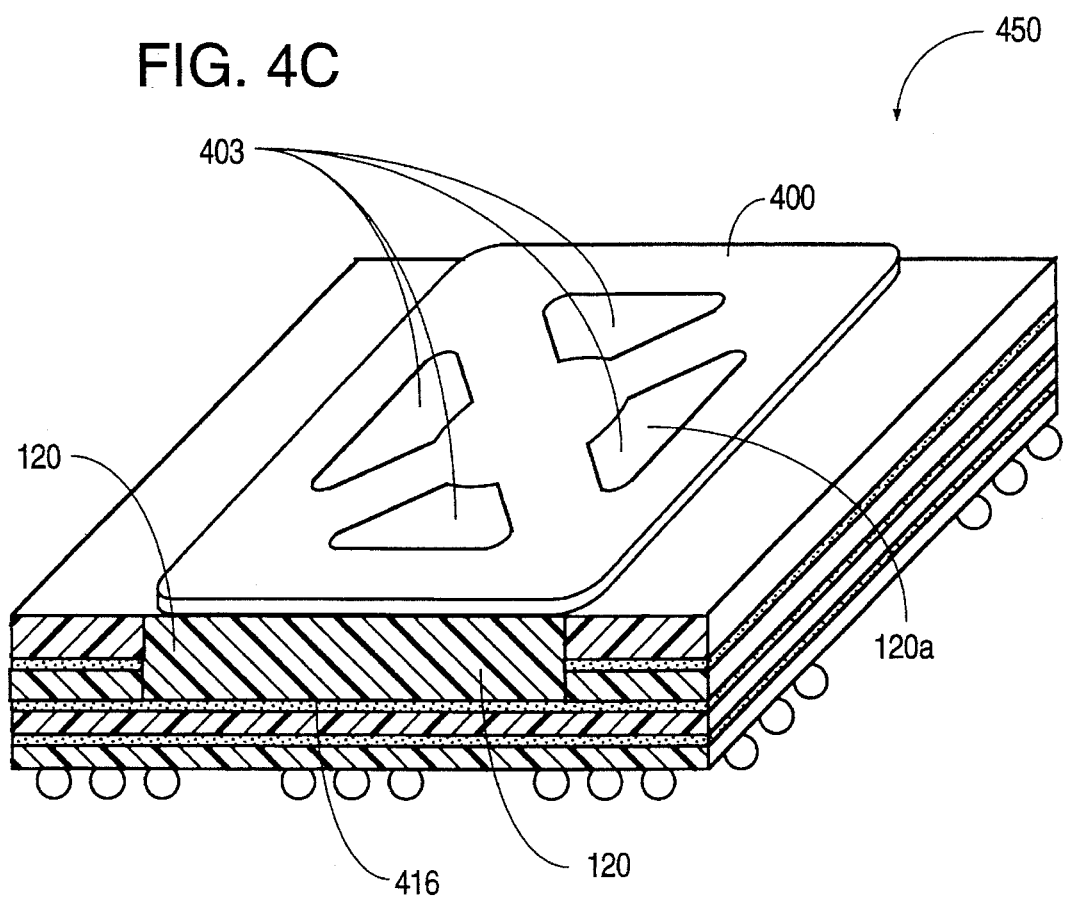
FIG. 4D is a side perspective view of the heat spreader positioned on the encapsulant in a cavity of a ball grid array according to the invention.

FIG. 4C is a perspective view of heat spreader 400 showing open regions 403, open region side walls 403a and, first or lower surface 405 of heat spreader 400. FIG. 4D is a side perspective view of heat spreader 400 positioned on first surface 120a of encapsulant 120 in cavity 416 of a ball grid array 450.

Figure 1A:
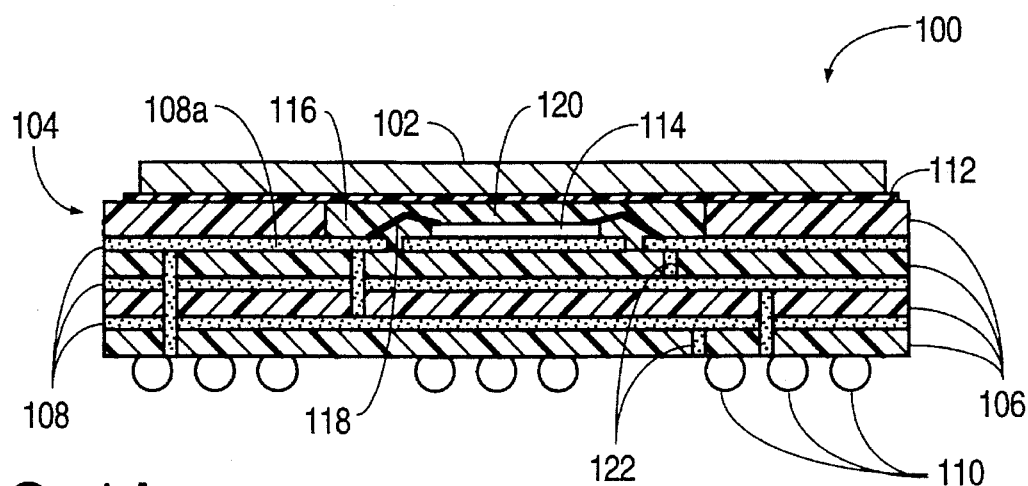
FIG. 1A is a cross-sectional side view of a ball grid array package with prior art heat spreader.
Figure 1B:
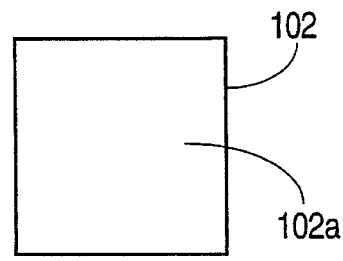
FIG. 1B is a plan view of the lower surface of prior art heat spreader.
Figure 1C:
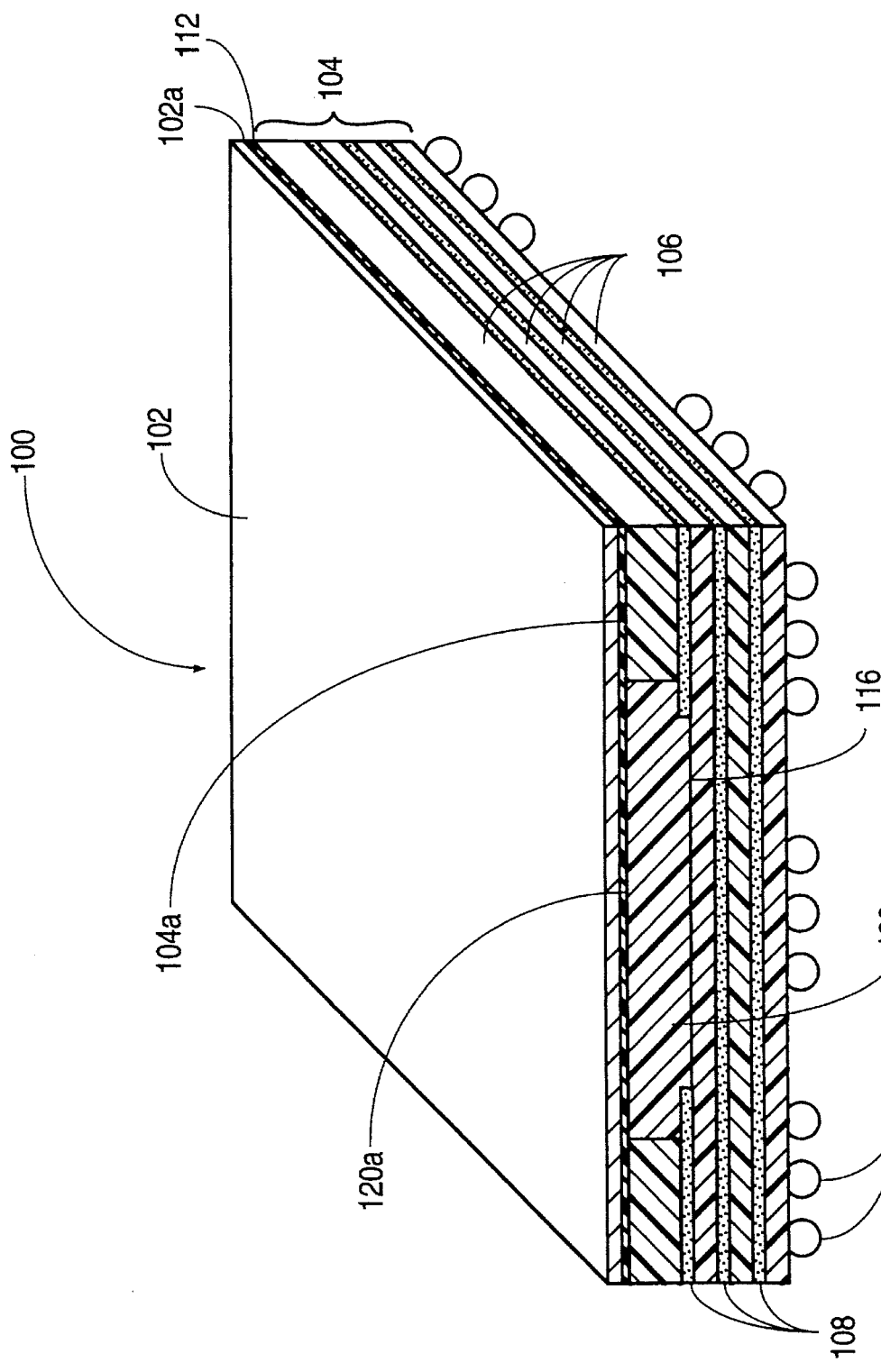
FIG. 1C is an perspective side view of prior art heat spreader attached to ball grid array.
Figure 2:
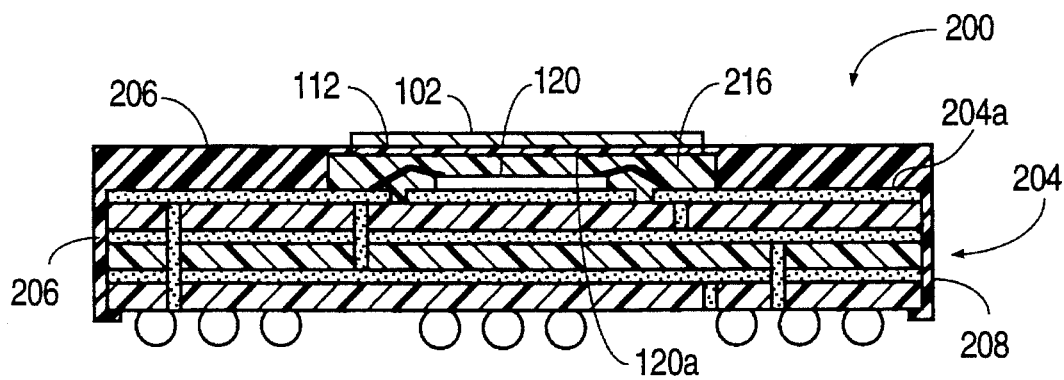
FIG. 2 is a cross-sectional side view of a second ball grid array package with prior art heat spreader.
Figure 3:
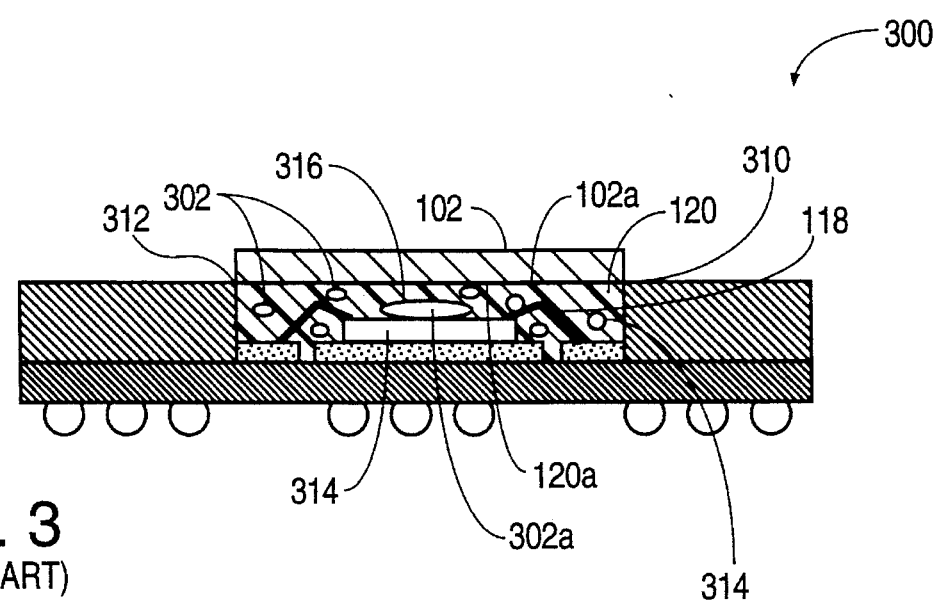
FIG. 3 is a cross-sectional side view of a ball grid array with prior art heat spreader applied directly to upper surface of encapsulant.

Open regions 403 of heat spreader 400 (shown with encapsulant filling the open regions) solve the air bubble problem discussed above. This is because air that would be trapped between a continuous surface, such as surface 102a of prior art heat spreader 102 (see FIGS. 1A and 1B) and encapsulant upper surface 120a, can escape through open regions 403 of heat spreader 400. Thus, with heat spreader 400, air is not forced down into encapsulant 120, as it is with prior art heat spreaders 102, to form air bubbles 302 (see FIG. 3). As a result, heat spreader 400 can be applied directly to first surface 120a of encapsulant 120 when encapsulant 120 is in its liquid form (see FIG. 4D) without the risk of forming air bubbles 302 (see FIG. 3). Therefore, heat spreader 400 eliminates the need for the extra, potentially insulating, adhesive layer 112 between integrated circuit chip 114 and heat spreader 102 (see FIGS. 1A and 1C).

In addition, with heat spreader 400, if any air bubbles do happen to form in liquid encapsulant 120, they only need to migrate as far as the nearest open region 403 to escape. In contrast, surface 102a of prior art heat spreader 102 is continuous (see FIGS. 1B and 1C). This means that air bubbles 302 must migrate all the way to the sides 310 or 312 of cavity 316 (see FIG. 3) before they can escape. However, encapsulant 120 often hardens before air bubbles 302 can migrate to sides 310 or 312 through encapsulant 120 in its highly viscous liquid form. Therefore, air bubbles 302 become permanently trapped in cavity 316, Another advantage of heat spreader 400 is that open regions 403 provide a secure form fitted bond between first surface 405 of heat spreader 400 and surface 120a of encapsulant 120. This is because heat spreader 400 is placed on surface 120a of encapsulant 120 when encapsulant 120 is in liquid form. When first surface 405 of heat spreader 400 (see FIG. 4B) contacts first surface 120a of encapsulant 120, encapsulant 120, in its liquid form, seeps into open regions 403 and covers sides 403a (see FIG. 4C) of open regions 403. Then, as encapsulant 120 hardens, a fitted bond is created between first surface 120a of encapsulant 120 and first surface 405 of heat spreader 400, including open region sides 403a. This form fitted bond is typically stronger than the bond formed between encapsulant surface 120a and the smooth surface 102a of prior art heat spreader 102 (see FIGS. 1B and 1C).

Figure 4E:
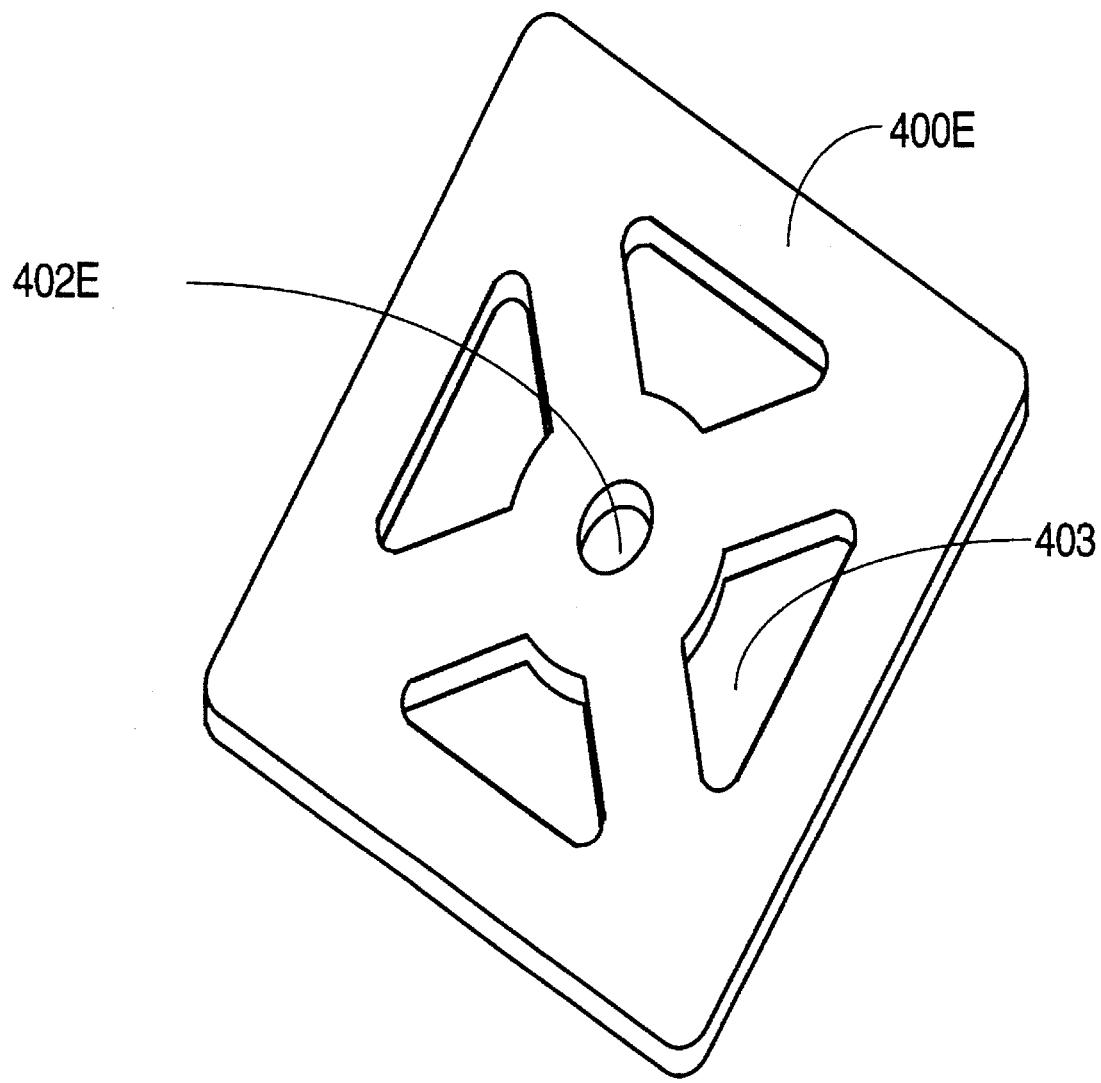
FIG. 4E is a perspective view of a second embodiment of a heat spreader in accordance with the invention.

FIG. 4E is a perspective view of a second embodiment of a heat spreader in accordance with the invention. Heat spreader 400E is identical to heat spreader 400 except that it includes the additional open area 402E in the center of the heat spreader 400E. Open area 402E provides increased opportunity for air bubbles to escape from encapsulant 120. Heat spreader 400E is just one example of the various other embodiments of heat spreaders which can be created in accordance with the invention that include permutations on the location, position and number of open regions 403.

Figure 5A:
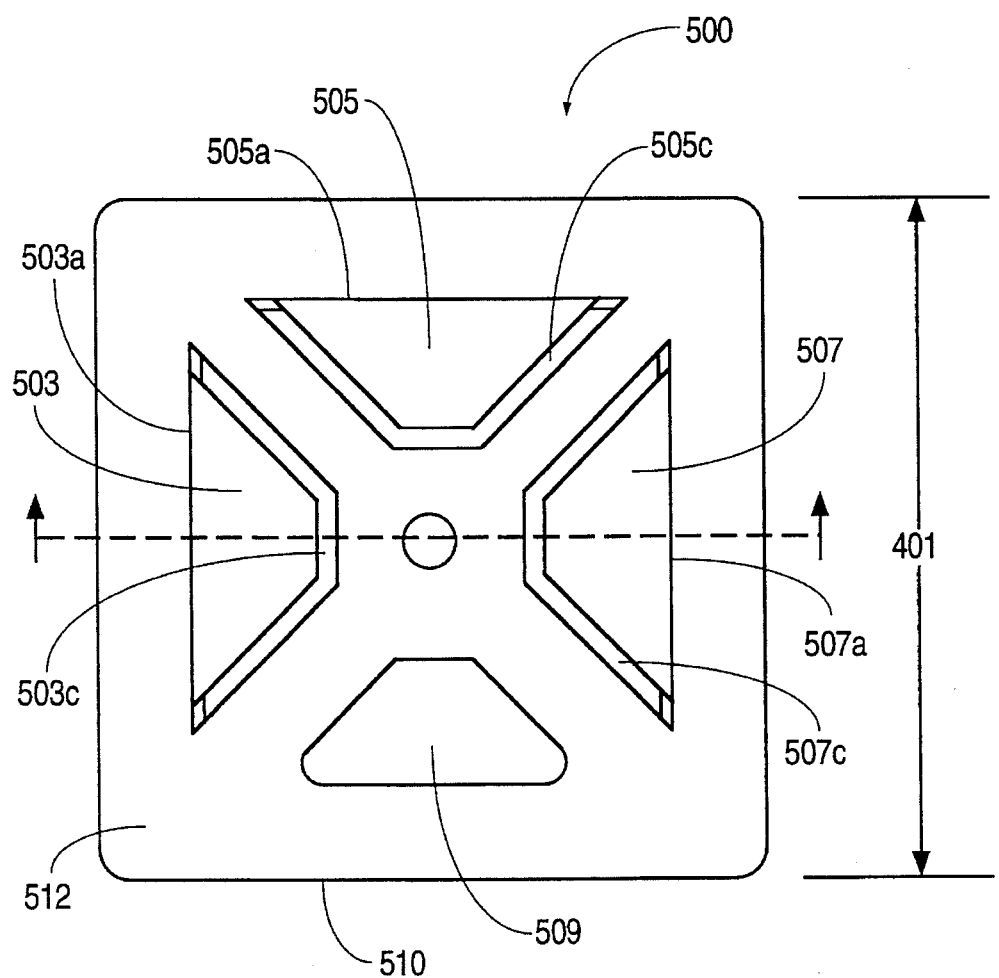
FIG. 5A is an plan view of a heat spreader with tabs in accordance with the invention.

FIG. 5A is an plan view of a heat spreader 500 with tabs 503, 505, and 507 in accordance with the invention. Heat spreader 500 is formed from a thermally conductive plate 512 and is similar to heat spreader 400 of FIG. 4A. However, in this embodiment of the invention, edge portions 503a, 505a, and 507a of heat spreader 500 are not punched or cut out as they were with heat spreader 400. Instead, cuts are made in the general shape of open regions 503c, 505c, and 507c while edge portions 503a, 505a, and 507a, respectively, are left attached to heat spreader 500.

Figure 5B:
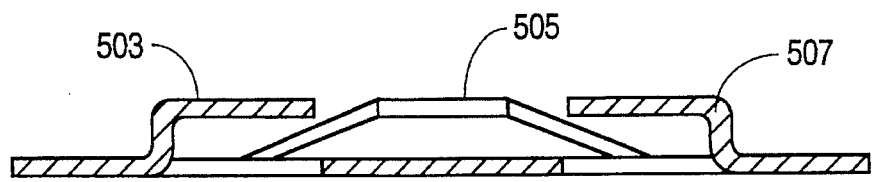
FIG. 5B is a side view of the heat spreader taken on line 5B—5B of FIG. 5A.

Once the incisions are made, the tab portions 503, 505, and 507 are bent outwardly along attached edge portion sides 503a, 505a, and 507a and shaped. In FIG. 5B tabs 503 and 507 are seen from the side showing one possibility for the general shape of tabs 503, 505, 507. From this perspective tab 505 is seen from the front.

In one embodiment of the invention, open regions 503c, 505c, and 507c are formed by creating tabs 503, 505, and 507 as describe above. However, open region 509 of heat spreader 500 is formed by a cutting or punching process as described above with respect to heat spreader 400 and FIG. 4A. Therefore, in one embodiment of the invention, tabs 503, 505, and 507 are formed on only three of the four sides of heat spreader 500. The reason for this particular configuration is described below.

Figure 5C:
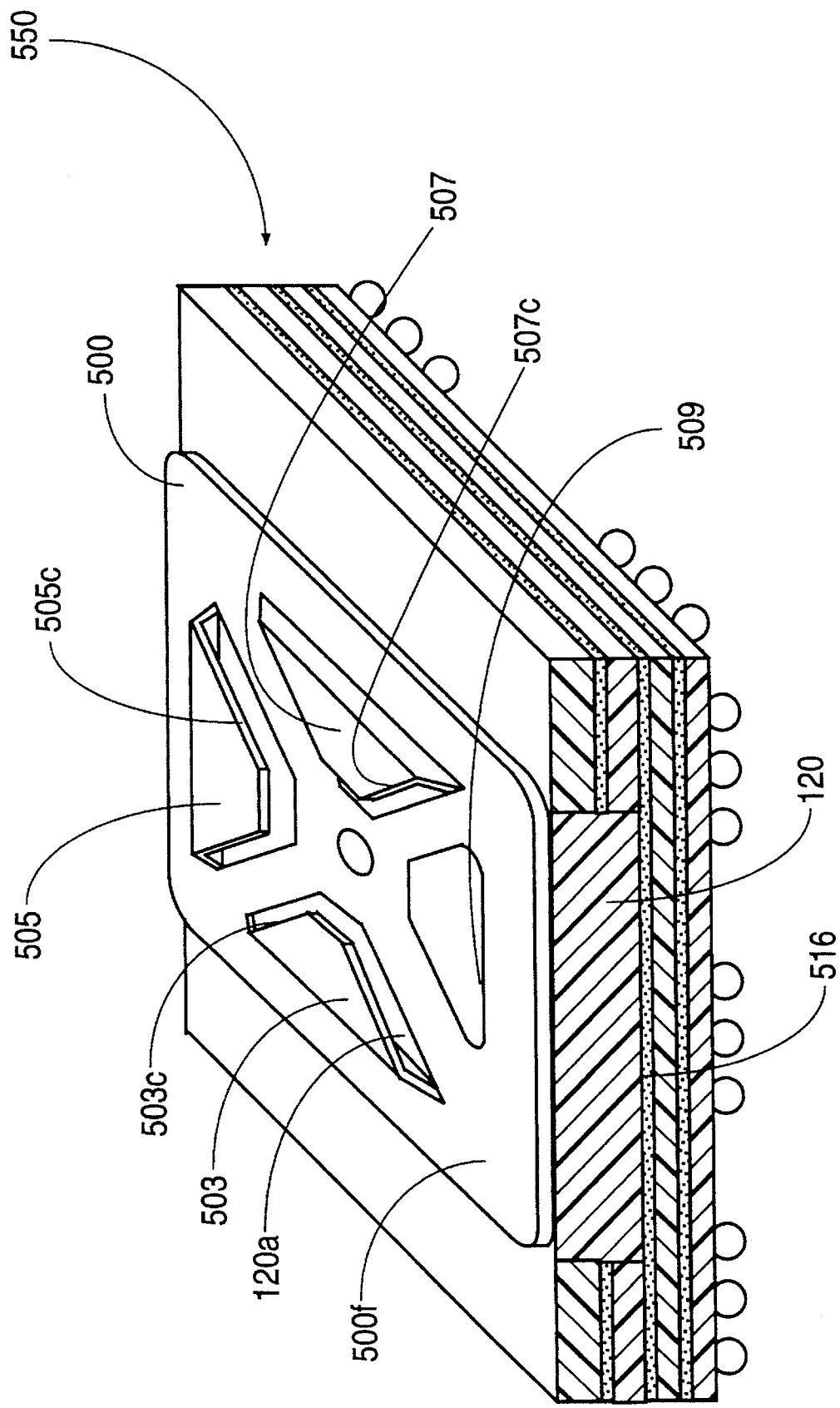
FIG. 5C is of side perspective view of the heat spreader positioned on a surface of an encapsulant in a cavity of a ball grid array.

FIG. 5C is a side perspective view of heat spreader 500 positioned on surface 120a of encapsulant 120 in cavity 516 of a ball grid array 550. With the exception of the formed tabs 503, 505 and 507, heat spreader 500 is identical to heat spreader 400 described above and is applied to ball grid array 550 in the same manner as described above with respect to heat spreader 400 and ball grid array 450.

Tabs 503, 505, and 507 can either simply provide additional surface area to dissipate heat away from the integrated circuit package or, in one embodiment of the invention, tabs 503, 505, and 507 are used to secure an supplemental heat spreader or heat tower to further increase the heat dissipation capability of the package.

Figure 5D:
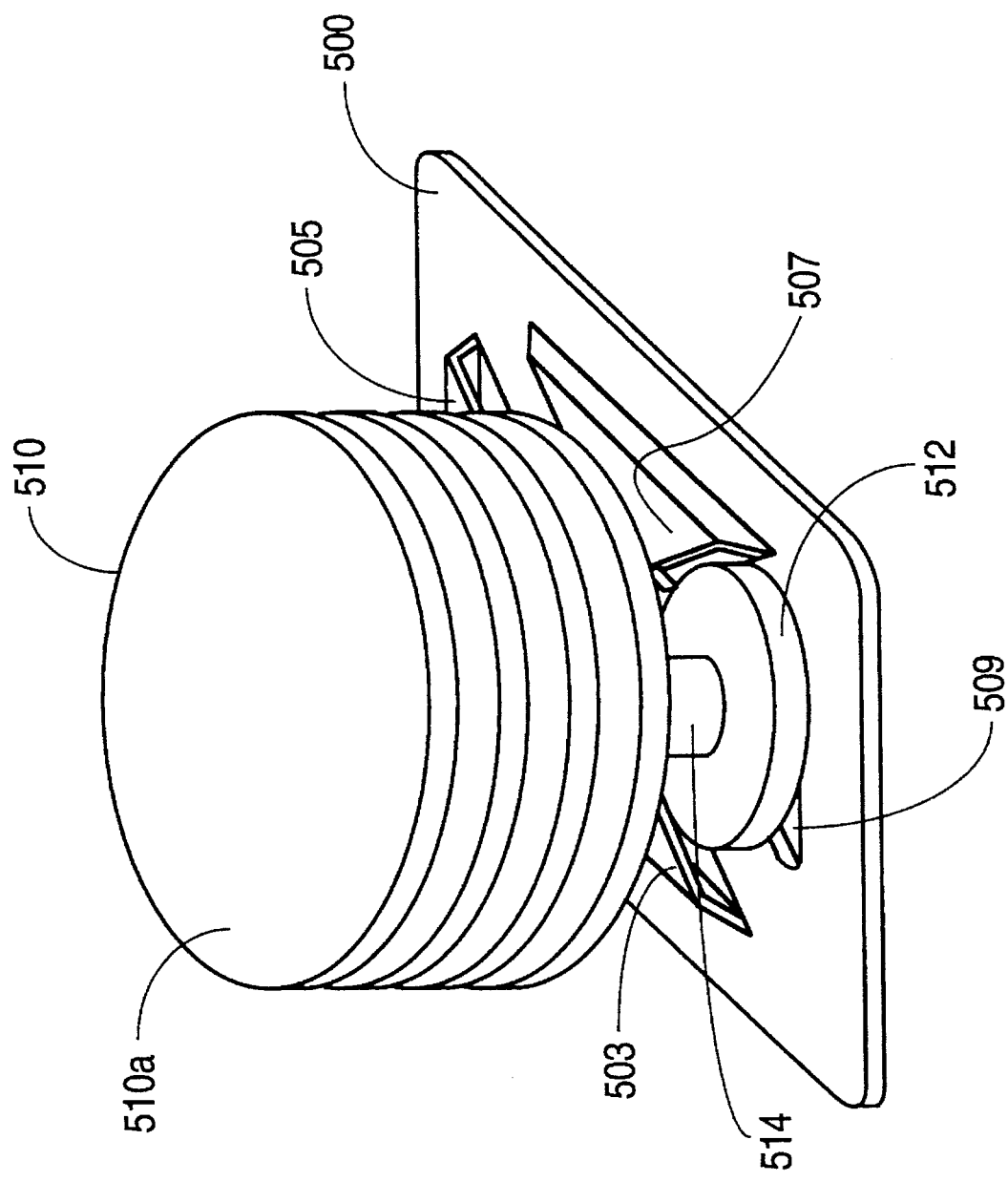
FIG. 5D is a side perspective view of a heat spreader with a heat tower partially slid into position within the tabs.
Figure 5E:
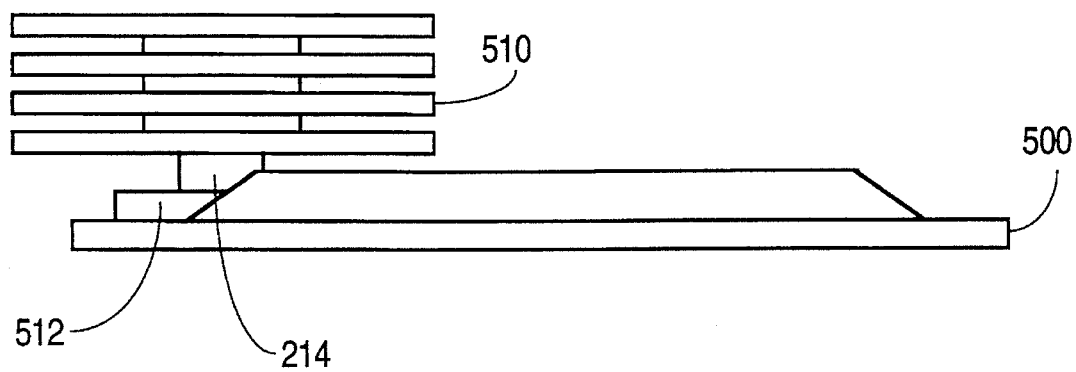
FIG. 5E is a side view thereof of FIG. 5D.

FIG. 5D is a side perspective view of heat spreader 500 with a heat tower 510 partially slid into position within tabs 503, 505, and 507. Heat tower 510 includes tower 510a, base 512 and stem 514. Heat tower 510 is removably attached to heat spreader 500 by sliding base 512 of heat tower 510 between tabs 503, 505, and 507. FIG. 5E shows the heat tower 510 partially slid into position on heat spreader 500.

Figure 5F:
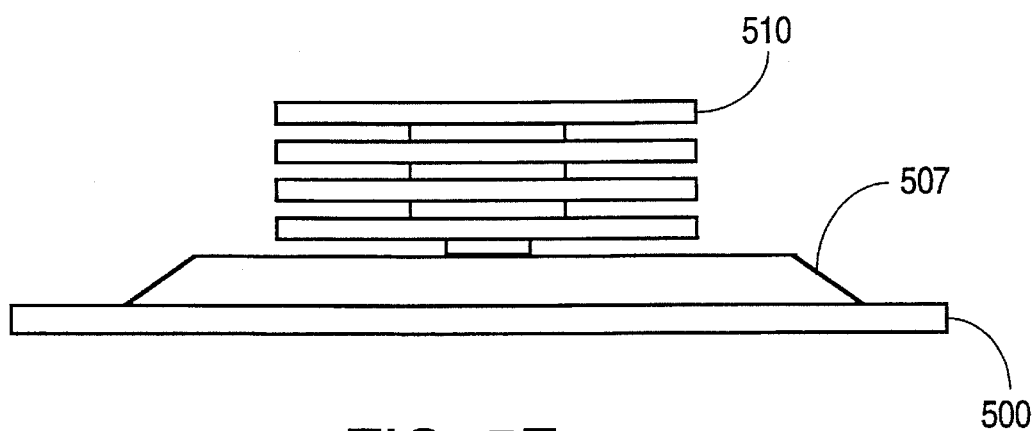
FIG. 5F is a side view of the heat tower fully positioned and secured within the tabs on the heat spreader.
Figure 5G:
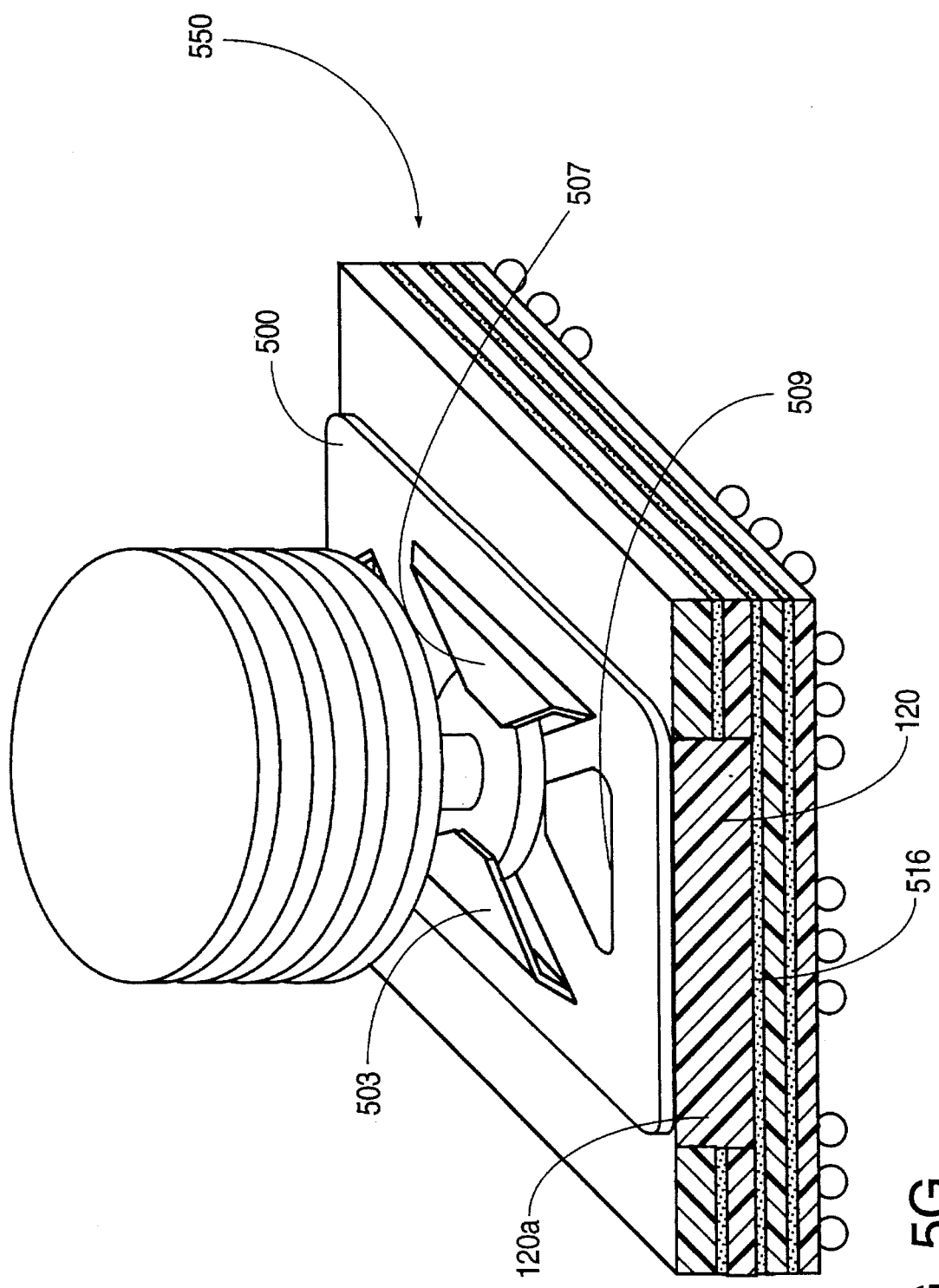
FIG. 5G is a side perspective view of the heat spreader, including the heat tower, bonded to an encapsulant surface of a ball grid array.

FIG. 5F shows the heat tower 510 fully positioned and secured within tabs 503, 505 (not shown in FIG. 5F), and 507 on heat spreader 500. FIG. 5G shows the heat spreader 500, including heat tower 510, bonded to surface 120a of encapsulant 120 of ball grid array 550.

Heat spreader 500 has all the advantages of heat spreader 400 described above, i.e., heat spreader 500 can be attached directly to surface 120a of encapsulant 120 without the use of adhesive layer 112 (see FIG. 1C), or the risk of air bubbles 302 (see FIG. 3) being trapped in encapsulant 120; heat spreader 500 also forms a fitted bond with upper surface 120a of encapsulant 120.

Heat spreader 500 also has several other advantages. For instance, tabs 503, 505, and 507 provide increased heat dissipation surface area and, if still greater heat dissipation capability is desired, tabs 503, 505, and 507 allow a supplementary heat spreader, such heat tower 510, to be quickly fitted to ball grid array 550. In addition, the size and shape of the supplementary heat spreaders such as heat tower 510, as well as the materials used to make them, can be varied to meet the demands of the customer. Thus, with an inventory of integrated circuit packages such as ball grid array 550, and a variety of supplementary heat spreader designs, a manufacturer can custom design integrated circuit packages in a matter of seconds.

Figure 6:
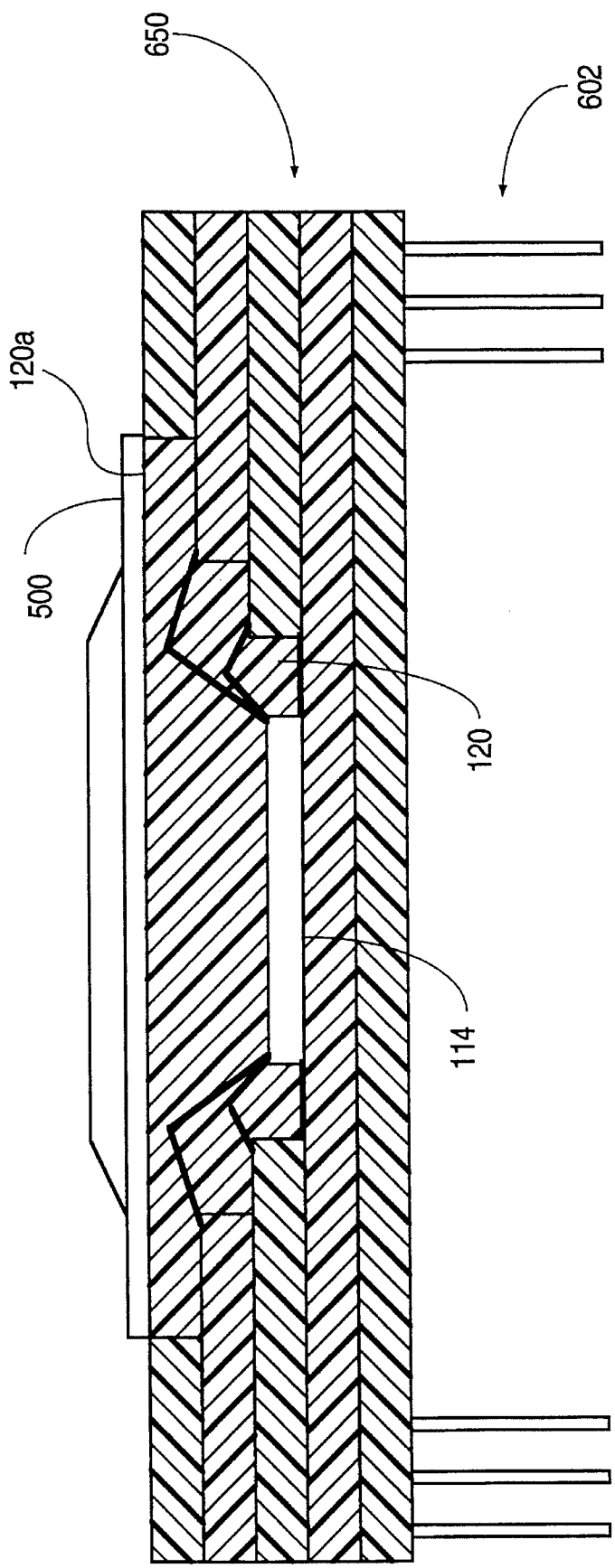
FIG. 6 is a heat spreader attached to a upper surface of an encapsulant in a pin grid array package.

The heat spreaders of the invention can also be used with integrated circuit packages other than ball grid arrays. FIG. 6 shows heat spreader 500 attached to a upper surface 120a of encapsulant 120 on a pin grid array package 650. Pin grid array 650 has a structure somewhat similar to ball grid array 550, however, instead of using solder balls 110 (see FIG. 1A) to make the electrical connection between the integrated circuit chip package and a higher level electrical component such as a printed circuit board (not shown), pin grid array 650 uses electrically conductive pins 602.

In addition to being used with ball grid arrays and pin grid arrays, the heat spreaders according to the invention can be used with virtually any type of integrated circuit package which incorporates protective encapsulant as part of the structure. Furthermore, the heat spreaders of the invention can be manufactured using equipment and production methods already employed in the integrated circuit packaging industry. Therefore, the heat spreaders according to the invention can be mass produced without the investment of prohibitively large amounts of capital.

Various embodiments of the invention have been described. The descriptions are intended to be illustrative, not limiting. Thus, it will be apparent to those of skill in the art that certain modifications can be made to the inventions described without departing from the true spirit and scope of the appended claims.

We claim:

1. A heat spreader and an encapsulated integrated package comprising:

a thermally conductive plate, said thermally conductive plate being of a predetermined shape and having a first surface and a second surface, opposite said first surface, said thermally conductive plate having a predetermined thickness;

at least one open region formed in said thermally conductive plate;

at least one tab extending above said at least one open region, said at least one tab being at least one integral bent tab extending from a respective side edge of said at least one open region; a supplementary heat spreader, at least part of said supplementary heat spreader being inserted under said at least one integral bent tab to create a press-fitted connection therebetween; and;

wherein said first surface of said thermally conductive plate is attached directly to an encapsulant surface of an encapsulated integrated circuit package.

2. The heat spreader as in claim 1, wherein said thermally conductive plate is aluminum, and the encapsulant extends onto side edges of said open regions and fills said regions, the second surface of said thermally conductive plate being exposed to an ambient environment.

3. The heat spreader as in claim 1, wherein said thermally conductive plate is copper and the encapsulant extends onto side edges of said open regions and fills said regions, the second surface of said thermally conductive plate being exposed to an ambient environment.

4. The heat spreader as in claim 1, wherein:

a supplementary heat spreader, said supplementary heat spreader has a base portion, wherein said supplementary heat spreader is positioned on said thermally conductive plate and said base portion of said supplementary heat spreader is inserted under said at least one tab of said thermally conductive plate to create the press-fitted connection between said base portion and said at least one bent tab.

5. The heat spreader as in claim 4, wherein said at least one tab comprises a series of spaced tabs and wherein said supplementary heat spreader is interference fitted under said series of spaced tabs.

6. The heat spreader as in claim 5, wherein said supplementary heat spreader is a heat tower.

7. A packaged integrated circuit comprising:

a substrate, said substrate including at least one layer of conductive trace material formed on said substrate, said substrate including a cavity, said cavity having a bottom surface;

an integrated circuit chip, said integrated circuit chip being attached to said bottom surface of said cavity, said integrated circuit chip being electrically connected to said at least one layer of conductive trace material formed on said substrate;

an encapsulant, said encapsulant being first in a liquid state and then hardening to a solid state, said encapsulant filling said cavity of said substrate and encapsulating said chip;

a heat spreader, said heat spreader being of a predetermined shape and having a first surface and a second surface, opposite said first surface, said heat spreader having a series of open regions, said heat spreader also having at least one tab;

wherein said heat spreader is bonded directly to said encapsulant and said encapsulant extends onto side walls of the open regions;

wherein said at least one tab is a series of integral bent tabs extending from ones of said side walls of said open regions; and further comprising a supplementary heat spreader, said supplementary heat spreader having a base portion, wherein said supplementary heat spreader is positioned on said heat spreader and inserted under said series of bent tabs by a press-fitted connection between said base portion and said series of bent tabs.

8. A packaged integrated circuit as in claim 7, wherein said supplementary heat spreader is a heat tower.

* * * * *